US010892290B2

(12) United States Patent
Qian et al.

(10) Patent No.: US 10,892,290 B2
(45) Date of Patent: Jan. 12, 2021

(54) INTERCONNECT LAYER CONTACT AND METHOD FOR IMPROVED PACKAGED INTEGRATED CIRCUIT RELIABILITY

(71) Applicant: OmniVision Technologies, Inc., Santa Clara, CA (US)

(72) Inventors: Yin Qian, Milpitas, CA (US); Chia-Chun Miao, Sunnyvale, CA (US); Ming Zhang, Fremont, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/937,742

(22) Filed: Mar. 27, 2018

(65) Prior Publication Data
US 2019/0305027 A1    Oct. 3, 2019

(51) Int. Cl.
*H01L 27/146*  (2006.01)
*H01L 23/48*  (2006.01)
(Continued)

(52) U.S. Cl.
CPC ...... *H01L 27/14634* (2013.01); *H01L 21/288* (2013.01); *H01L 21/32139* (2013.01);
(Continued)

(58) Field of Classification Search
CPC .......... H01L 27/14634; H01L 23/5226; H01L 21/32139; H01L 21/288; H01L 27/14636;
(Continued)

(56) References Cited

U.S. PATENT DOCUMENTS 6,537,851 B1 * 3/2003 Lin ................... H01L 24/11
257/E21.508
8,610,283 B2    12/2013 Farooq et al.
(Continued)

FOREIGN PATENT DOCUMENTS

TW        201405791 A    2/2014
TW          I473233 B    2/2015
TW        201630135 A    8/2016

OTHER PUBLICATIONS

Yield Engineering Systems, Inc. "RDL—Bond Pad Redistribution Layers" 2012, 4 pages.
(Continued)

*Primary Examiner* — David Vu
(74) *Attorney, Agent, or Firm* — Lathrop GPM LLP

(57) ABSTRACT

Packaged photosensor ICs are made by fabricating an integrated circuit (IC) with multiple bondpads; forming vias from IC backside through semiconductor to expose a first layer metal; depositing conductive metal plugs in the vias; depositing interconnect metal; depositing solder-mask dielectric over the interconnect metal and openings therethrough; forming solder bumps on interconnect metal at the openings in the solder-mask dielectric; and bonding the solder bumps to conductors of a package. The photosensor IC has a substrate; multiple metal layers separated by dielectric layers formed on a first surface of the substrate into which transistors are formed; multiple bondpad structures formed of at least a first metal layer of the metal layers; vias with metal plugs formed through a dielectric over a second surface of the semiconductor substrate, interconnect metal on the dielectric forming connection shapes, and shapes of the interconnect layer coupled to each conductive plug and to solder bumps.

11 Claims, 4 Drawing Sheets

(51) Int. Cl.
  *H01L 23/522* (2006.01)
  *H01L 23/00* (2006.01)
  *H01L 21/768* (2006.01)
  *H01L 23/528* (2006.01)
  *H01L 23/532* (2006.01)
  *H01L 21/288* (2006.01)
  *H01L 21/3213* (2006.01)

(52) U.S. Cl.
  CPC .. *H01L 21/76897* (2013.01); *H01L 21/76898* (2013.01); *H01L 23/481* (2013.01); *H01L 23/528* (2013.01); *H01L 23/5226* (2013.01); *H01L 23/53209* (2013.01); *H01L 23/53228* (2013.01); *H01L 24/03* (2013.01); *H01L 24/11* (2013.01); *H01L 24/13* (2013.01); *H01L 24/81* (2013.01); *H01L 27/1464* (2013.01); *H01L 27/1469* (2013.01); *H01L 27/14636* (2013.01); *H01L 27/14643* (2013.01); *H01L 2224/0231* (2013.01); *H01L 2224/0239* (2013.01); *H01L 2224/03452* (2013.01); *H01L 2224/03464* (2013.01); *H01L 2224/05147* (2013.01); *H01L 2224/05155* (2013.01); *H01L 2224/05166* (2013.01); *H01L 2224/05569* (2013.01); *H01L 2224/05573* (2013.01); *H01L 2224/08145* (2013.01); *H01L 2224/13024* (2013.01); *H01L 2224/13111* (2013.01); *H01L 2224/13116* (2013.01); *H01L 2224/13139* (2013.01); *H01L 2224/13147* (2013.01); *H01L 2224/81815* (2013.01); *H01L 2924/3512* (2013.01)

(58) Field of Classification Search
  CPC ......... H01L 23/53209; H01L 23/53228; H01L 24/13; H01L 23/528; H01L 27/1464; H01L 23/481; H01L 27/1469; H01L 24/11; H01L 21/76897; H01L 21/76898; H01L 24/03; H01L 24/81; H01L 27/14643
  See application file for complete search history.

(56) References Cited

U.S. PATENT DOCUMENTS

| | | |
|---|---|---|
| 8,878,325 B2 | 11/2014 | Wan et al. |
| 2002/0180027 A1* | 12/2002 | Yamaguchi ........... H01L 21/486 257/700 |
| 2004/0129991 A1* | 7/2004 | Lai ...................... H01L 31/0203 257/433 |
| 2010/0155796 A1* | 6/2010 | Koike ............... H01L 21/76898 257/292 |
| 2011/0122303 A1 | 5/2011 | Bonkohara |
| 2013/0083229 A1* | 4/2013 | Lin ................... H01L 27/14623 348/336 |
| 2016/0181212 A1* | 6/2016 | Liu ........................ H01L 24/02 |
| 2016/0233260 A1* | 8/2016 | Yiu .................. H01L 27/14632 |

OTHER PUBLICATIONS

Teutsch, T., et al. "Wafer Level CSP using Low Cost Electroless Redistribution Layer", 2000 Proceedings. 50th Electronic Components and Technology Conference; 8 pages.
Taiwan Patent Application No. 108103353, English translation of Office Action dated Aug. 20, 2019, 4 pages.
Taiwan Patent Application No. 108103353, Office Action dated Aug. 20, 2019, 6 pages.
Taiwan Patent Application No. 108103353, Office Action dated Dec. 16, 2019, with English translation, 8 pages.

* cited by examiner

INTERCONNECT LAYER CONTACT AND METHOD FOR IMPROVED PACKAGED INTEGRATED CIRCUIT RELIABILITY

BACKGROUND

An interconnect layer is needed to adapt integrated circuit bonding layouts to match bonding locations of some integrated circuit packages, particularly when ballbonding is used. This interconnect layer connects bondpads of the integrated circuit to bonding points for solder-ball bonds. These solder-ball bonds in turn connect the integrated circuit to connection points of an integrated circuit package.

The topside metal of bondpads of integrated circuits often has thick metal that resists mechanical damage from mechanical stresses including stresses from temperature changes, the bonding process, or vibration. Other portions of the integrated circuit, including metal layers underlying bondpads, typically have thinner metal layers that are less resistant to mechanical damage.

Most integrated circuits function with either the chip top or chip bottom connected to the package. The chip top is the side into which diffusions were performed and on which interconnect layers were deposited during integrated circuit fabrication. Photosensor integrated circuits, however, require a particular photosensor light-admission side of the top or bottom sides be exposed to light admitted through a window or lens in the package. Orienting these circuits in any other way than with the designed light-admission side exposed to light impairs photosensor functionality.

A bondpad area of a photosensor array integrated circuit 100 packaged using such an interconnect layer, in a prior technique illustrated in FIG. 1, has vias 102 etched through the semiconductor substrate 104 to expose a thin first-metal layer 106. The via 102 is lined with an insulator 108 with the center of each via 102 etched bare to expose thin first-metal layer 106. An interconnect layer metal 110 is deposited into the via contacts thin first-metal layer 106 in a contact portion 112 of the bondpad. The bondpad also has multiple vias 115 and a thick bonding-metal portion 117 lying over portion 112 of thin first-metal layer 106; the bondpad area 100 may also have intermediate metal layers 119.

Integrated circuits packaged using an interconnect layer according to FIG. 1 occasionally fail under mechanical stress because the thin first-metal layer 106 lacks sufficient mechanical strength, particularly where etching of vias 102 results in thinning of the first-metal layer 106 in contact portion 112 of the bondpad area, or where metal of first-metal 106 layer partially diffuses or dissolves into the interconnect layer metal. This thinning and later mechanical stress results in cracking, such as crack 121, typically at or near edges of portion 112 of thin first-metal layer 106. Cracks may propagate due to metal migration and may eventually impede current flow.

SUMMARY

In an embodiment, packaged photosensor arrays are made by fabricating a first integrated circuit (IC) with multiple bondpads; forming vias through a semiconductor to expose a first layer metal of the bondpads; depositing conductive metal plugs in the vias; depositing interconnect metal; depositing solder-mask dielectric over the interconnect metal and openings therethrough; forming solder bumps on interconnect metal at the openings in the solder-mask dielectric; and bonding the solder bumps to conductors of a package.

In another embodiment, a photosensor IC has a first substrate; multiple metal layers separated by dielectric layers formed on a first surface of the substrate; multiple bondpad structures formed of at least a first metal layer of the metal layers; vias formed through the semiconductor substrate to the first layer metal and filled with metal plugs. The IC has a dielectric formed over a second surface of the semiconductor substrate, the interconnect metal forming connection shapes, shapes of the interconnect layer being coupled to each conductive plug and to solder bumps.

DETAILED DESCRIPTION OF THE EMBODIMENTS

Figure 2:
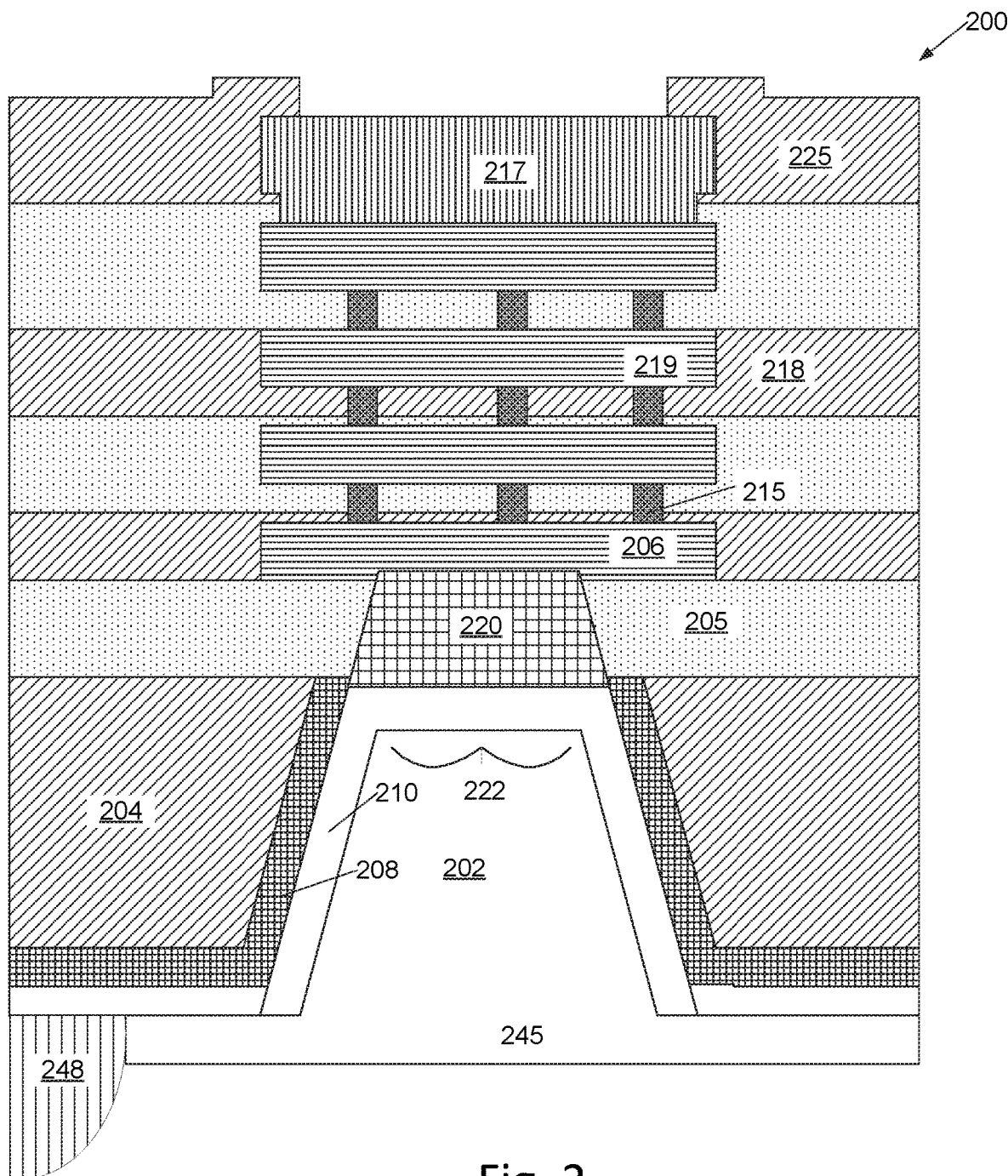
FIG. 2 is a cross sectional diagram of an embodiment of an improved interconnection layer contact for solder-bump bonding of front-side-interconnect photosensor arrays.

In an improved bondpad area 200 for photosensor array integrated circuits, illustrated in FIG. 2, vias 202 are etched through a semiconductor substrate 204 and an inter-layer dielectric 205 to expose a thin first-metal layer 206, typically of copper and silicon-doped aluminum. Transistors, such as transistors of decoders of a photosensor array, are formed in the semiconductor substrate 204. Inter-layer dielectric 205 may be silicon dioxide or a lower-capacitance dielectric material. The wafer back and sidewalls of via 202 are lined with an insulator 208, which may be silicon dioxide or another dielectric material; this lining is removed from a central region of the via to re-expose first-metal layer 206.

Prior to depositing interconnect metal layer 210, a conductive plug 220 is deposited onto exposed first metal 206, in a particular embodiment conductive plug 220 is formed of electroless nickel with deposition catalyzed by first metal 206, and forms a barrier between interconnect layer metal 210 and thin first-metal layer 206. Interconnect layer metal 210 then contacts the plug 220 in portion 212 of the bondpad area. Interconnect metal 210 is formed of a titanium-copper-nickel alloy. In an alternative embodiment, conductive plug 220 is formed of a nickel-gold alloy.

The bondpad area 200 also has multiple vias 215 and a thick bonding-metal portion 217 lying over portion 212 of thin first-metal layer 206; the bondpad area may also have one, two, or more intermediate metal layers 219 with associated intermetal dielectric 218 and vias. There may in some embodiments be an opening in a passivation-dielectric layer 225 to expose bonding-metal portion 217.

Figure 1:
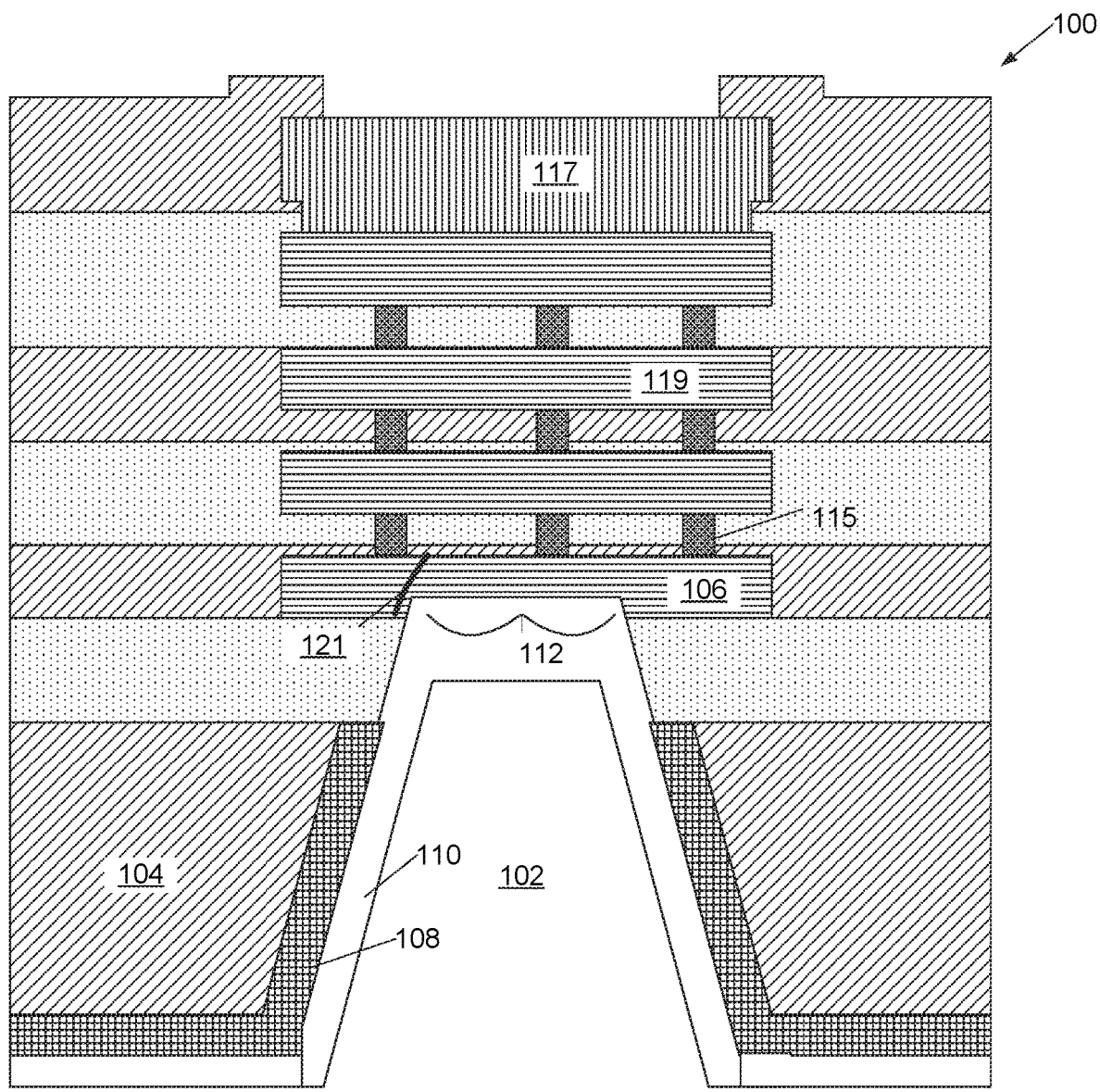
FIG. 1 is a cross sectional diagram of a prior art interconnection layer contact for solder-bump bonding of front-side-interconnect photosensor arrays.

Integrated circuits packaged using a conductive plug 220 between shapes on interconnect metal layer 210 and first-metal 206 according to FIG. 2 are less likely to fail under mechanical stress than devices of FIG. 1. Improved resistance to mechanical stress results from: (a) thin first-metal layer 206 is chemically isolated from metal of interconnect 210 and hence cannot dissolve into interconnect 210, and (b) thin first-metal layer 206 is mechanically reinforced by conductive metal of plug 220. This chemical isolation and mechanical reinforcement results in less cracking than with conventional processing.

Stacked photosensor arrays benefit from having photodiodes formed in a second semiconductor wafer, with decoder-drivers, pixel selection circuitry and sense amplifiers, analog-to-digital converters, and other support circuitry formed in a first semiconductor wafer. In stacked photosensor arrays, the first and second semiconductor wafers are stacked, and interconnects between die of each wafer being formed at the pixel level or at the level of a small group of pixels. Stacked photosensor arrays permit forming photodiodes of different materials than support circuitry, thereby allowing sensitivity to different wavelengths of light than possible if the photodiodes were integrated into the first semiconductor wafer, and permits denser packing of photodiodes than when photodiodes are commingled with the support circuitry.

A stacked photosensor array 300 (FIG. 3) with backside-illuminated photodiodes has a first integrated circuit having lower-level interconnect metal, vias, and dielectric layers, as well as conductive plugs, resembling those of the improved photosensor array 200 of FIG. 2. Layers corresponding to those of FIG. 2 have the same reference numbers in FIG. 3. The second integrated circuit 340 includes the photodiode array. The first integrated circuit 342 of the stacked array has an upper-level metal 302 that in some places where connections are to be made from the first integrated circuit to a second integrated circuit has a metal plug 304 extending from upper level metal 302 through a first integrated circuit insulating passivation layer 306. The second integrated circuit has corresponding plugs 310 extending from metal plugs 304 through its uppermost passivation layer 312 to its uppermost metal interconnect 314. Vias, such as via 316, connect metal interconnect 314 to one or more layers of intermediate interconnect 318 and to a bottommost metal 320, passing through dielectric 322, 324. An opening 328 may in some embodiments be etched in semiconductor 326 of the second integrated circuit and filled with a bonding-pad metal 330 usable for testing, bonding pad metal 330 connected to bottommost metal 320 by yet more vias 332.

Figure 3:
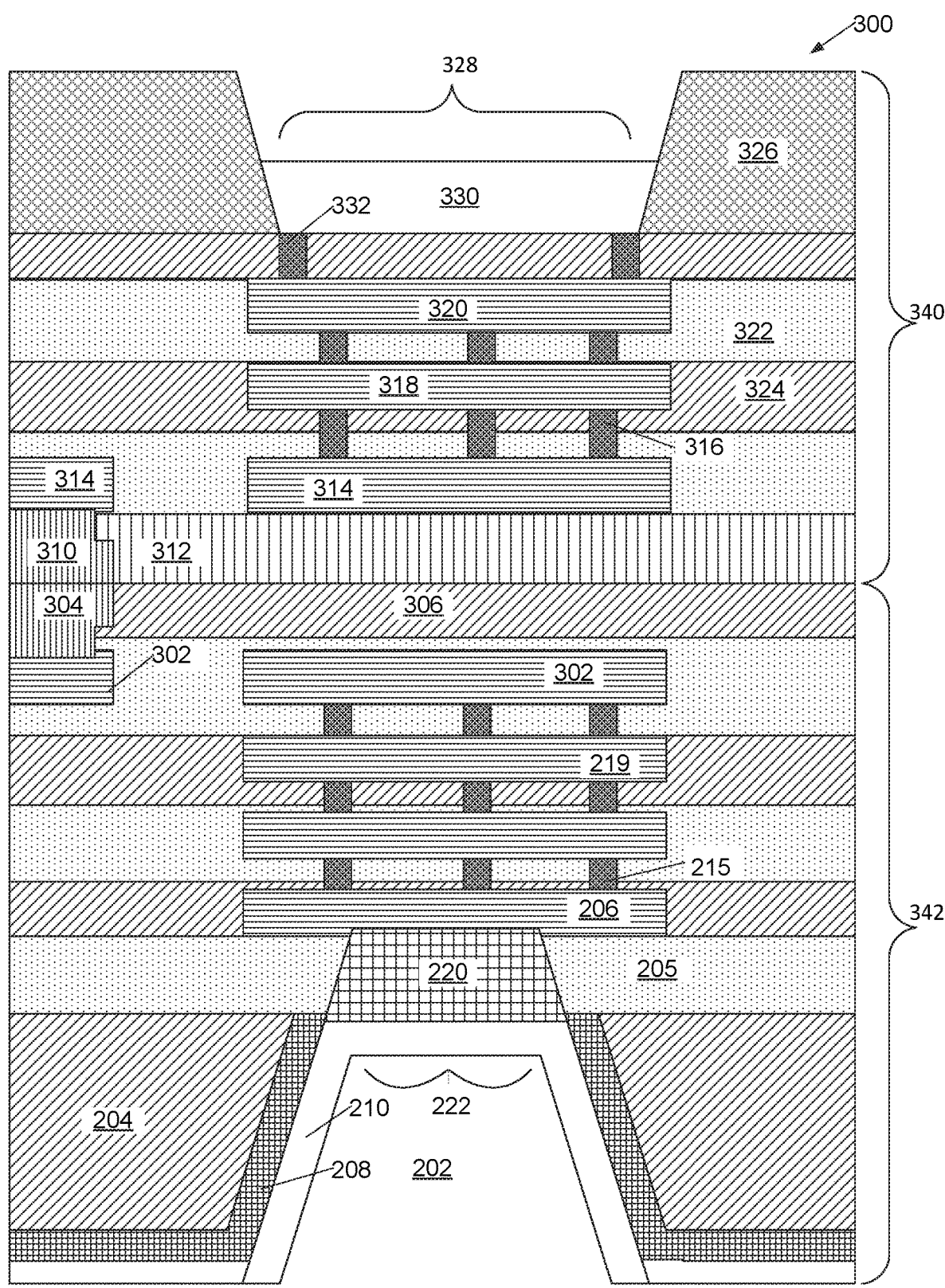
FIG. 3 is a cross sectional diagram of embodiment of a stacked photosensor array showing an improved interconnection layer contact for solder-bump bonding of the array.
Figure 4:
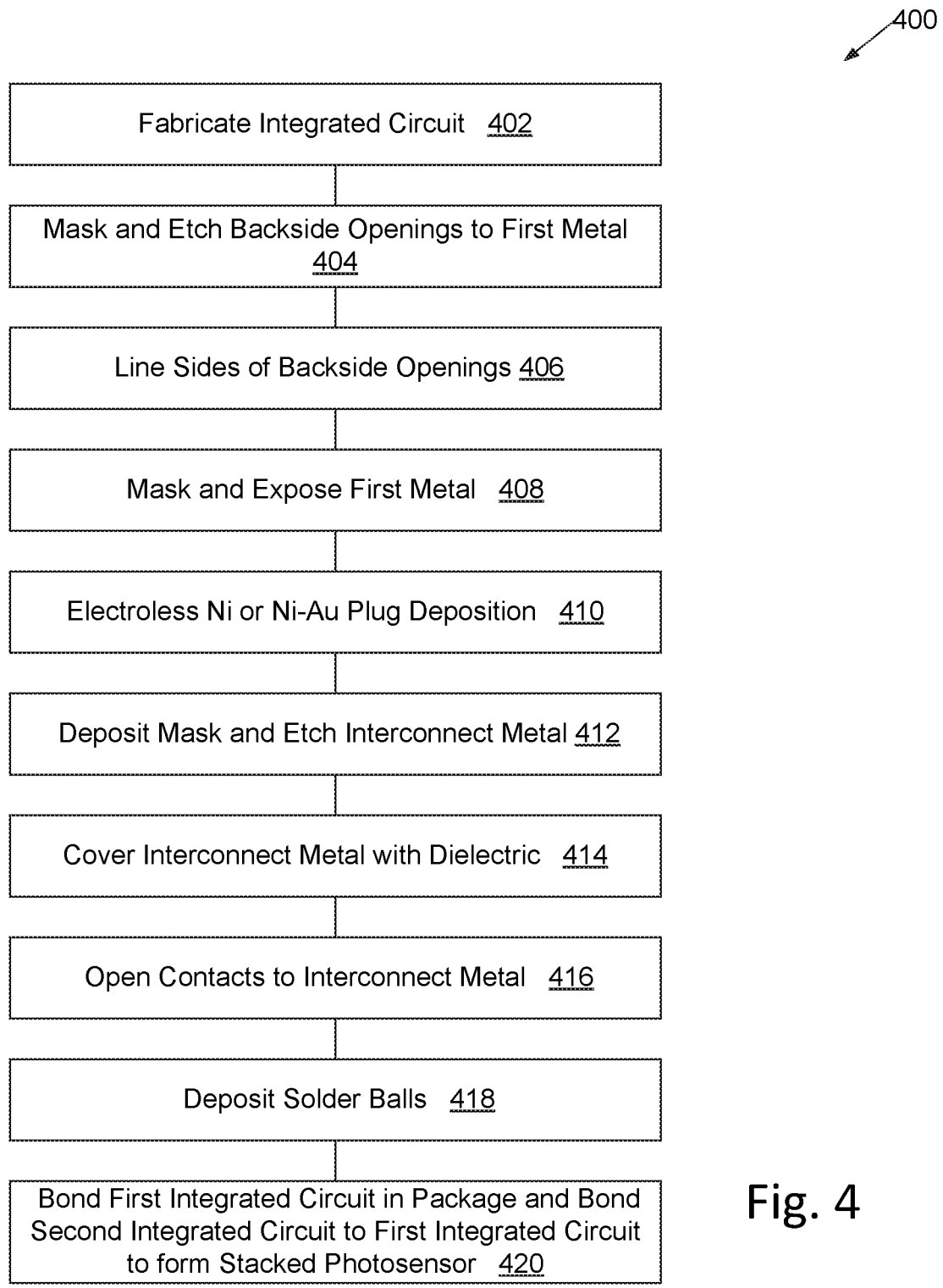
FIG. 4 is a flowchart of embodiment of a method for fabricating improved interconnection layer contacts for solder-bump bonding of photosensor arrays.

The device illustrated in FIG. 2 or 3 is made according to a process 400 illustrated in FIG. 4. After fabrication 402 of the integrated circuit wafer, the backside of the wafer is masked and etched 404 to open vias 202 and expose the first layer metal 206. The backside of the wafer and walls of the vias are lined 406 with a dielectric 208, in an embodiment the dielectric is polyimide, and first-level metal 206 is re-exposed, in an embodiment with a masking step and an etch step. An electroless metal deposition 410, in an embodiment depositing either nickel or nickel-gold alloy, is performed to build metal plugs 220 in via 202 bottoms. A surface prep is performed, then deposition 412 masking, and etching are performed to pattern the interconnect layer 210 into interconnect shapes, typically with separate shapes on the interconnect layer for each via. Next, a layer of solder-mask dielectric 245 is deposited 414 over the interconnect layer; solder-mask dielectric in a particular embodiment is polyimide, solder mask dielectric 245 may or may not be a conformal coating, and is opened in specific areas for deposition of solder bumps.

In an embodiment, electroless deposition 410 of the metal plugs 220 in via 202 bottoms is performed by plasma-enhanced chemical vapor deposition (PECVD) to deposit a catalytic nanolayer, five to ten nanometers thick, that enhances chemical vapor deposition or wet electroless chemical metal deposition in the openings.

In embodiments wet electroless chemical deposition is used to deposit 412 the interconnect metal 210, the interconnect metal 210 may be titanium-copper-nickel alloy or another copper alloy.

Openings are then formed 416 in the dielectric to expose shapes on the interconnect layer where solder bumps are to be formed, and solder bumps deposited 418. In a particular embodiment, solder bumps are 37 percent lead, 63 percent tin. In alternative embodiments, lead-free low-melting-point alloys are used for solder bumps 248 instead of lead-tin alloy, in a particular embodiment these lead-free solder bumps are formed of a low-melting tin-silver-copper alloy. Once bumps are formed, the integrated circuit 340 may be placed in and soldered 420 to an integrated circuit package by conventional reflow techniques. Any second integrated circuit, such as integrated circuit 340, is also bonded to integrated circuit 342

Shapes of the interconnect layer each electrically couple one or more solder bumps 248 to one or more of the metal plugs 220, and thence to the first-metal layer.

In an alternative embodiment of stacked photosensor embodiments, conventional techniques are used to form the second integrated circuit 340. This is then inverted and bonded to the first integrated circuit 342 to form a composite wafer. The composite wafer is then diced and packaged, instead of bonding the first 342 and second 340 integrated circuits after mounting the first integrated circuit to the package.

The resulting bumped composite die are then bonded 420 to IC packages to form packaged, stacked, photosensors.

Combinations of Features

The features herein disclosed may be combined in a variety of ways. Particular combinations anticipated by us include:

A method designated A of forming a packaged photosensor array includes fabricating a first integrated circuit with a plurality of bondpads; forming vias through a semiconductor of the first integrated circuit to expose a first layer metal of a plurality of the bondpads; depositing conductive metal plugs in the vias; depositing and masking interconnect metal coupled to the conductive metal plugs; depositing a solder-mask dielectric over the interconnect metal and forming openings therethrough; forming solder bumps attached to interconnect metal at the openings in the solder-mask dielectric; and bonding the solder bumps to conductors of an integrated circuit package.

A method designated AA including the method designated A further comprising exposing the first layer of metal in the vias after lining the vias with a dielectric, A method designated AB including the method designated A or AA further comprising bonding a second integrated circuit comprising an array of photodiodes to a top surface of the first integrated circuit.

A method designated AC including the method designated A or AA wherein the first integrated circuit comprises an array of photodiodes.

A photosensor integrated circuit designated B includes a first semiconductor substrate comprising transistors; a plurality of metal layers separated by dielectric layers formed on a first surface of the semiconductor substrate; a plurality of structures formed of at least a shape on a first metal layer of the plurality of metal layers; a plurality of vias formed through the semiconductor substrate with conductive plugs formed in the plurality of vias, the conductive plugs coupled to the shape on the first metal layer; an interconnect metal deposited over a dielectric over a second surface of the semiconductor substrate, the interconnect metal forming connection shapes, the connection shapes each being coupled to a conductive plug; and a plurality of solder bumps deposited onto the connection shapes.

A photosensor integrated circuit designated BA including the photosensor integrated circuit designated B wherein the conductive plugs are formed of an alloy comprising nickel.

A photosensor integrated circuit designated BB including the photosensor integrated circuit designated B or BA wherein the interconnect metal comprises copper.

A photosensor integrated circuit designated BC including the photosensor integrated circuit designated B, BA, or BB, wherein the first semiconductor substrate comprises an array of photodiodes.

A photosensor integrated circuit designated BD including the photosensor integrated circuit designated B, BA, or BB, further comprising:
a second semiconductor substrate comprising an array of photodiodes;
a plurality of metal and dielectric layers formed on a first surface of the second semiconductor substrate; and wherein
a top surface of the plurality of the plurality of metal and dielectric layers formed on the first surface of the semiconductor substrate being bonded to a top surface of the plurality of metal and dielectric layers formed on the first semiconductor substrate.

A photosensor integrated circuit designated BE including the photosensor integrated circuit designated B, BA, BB, BC, or BD, wherein the first semiconductor substrate comprises silicon.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A method of forming a packaged photosensor array comprising:
   fabricating a first integrated circuit having a plurality of bondpads;
   forming vias through a semiconductor substrate and a dielectric layer of the first integrated circuit to expose a first layer metal of the plurality of the plurality of bondpads;
   mechanically reinforcing the first layer metal of the plurality of bondpads by depositing a single-layer conductive metal plug conformal to a shape of each via and in contact with the first layer metal of the plurality of bondpads in the vias;
   after depositing the conductive metal plugs in the vias, depositing and masking an interconnect metal conformal to walls of each via and in contact with the associated conductive metal plug in each via, the interconnect metal extending beyond each via;
   depositing a solder-mask dielectric over the interconnect metal and forming openings therethrough;
   forming solder bumps on the interconnect metal at the openings in the solder-mask dielectric; and
   bonding the solder bumps to conductors of an integrated circuit package;
   wherein the only metal in contact with the metal plugs are the interconnect metal and the first layer metal,
   and wherein the metal plugs chemically isolate the interconnect metal from the first layer metal.

2. The method of claim 1 further comprising exposing the first metal layer in the vias after lining the vias with a dielectric and before reinforcing the first layer metal of the plurality of bondpads by depositing the conductive metal plugs, wherein the depositing of the conductive metal plugs and depositing of the interconnect metal are separate.

3. The method of claim 2 further comprising bonding a second integrated circuit comprising an array of photodiodes to a top surface of the first integrated circuit.

4. The method of claim 2, wherein the first integrated circuit comprises an array of photodiodes.

5. The method of claim 1 wherein the depositing the conductive metal plugs is performed by electroless deposition of nickel catalyzed by the first layer metal of the plurality of bondpads or a catalytic nanolayer formed on the first layer metal of the bondpads.

6. A photosensor integrated circuit comprising:
   a first semiconductor substrate comprising transistors;
   a plurality of metal layers comprising a first metal layer separated by dielectric layers formed on a first surface of the semiconductor substrate;
   a plurality of structures formed of at least a shape on a first metal layer of the plurality of metal layers;
   a plurality of vias formed through the semiconductor substrate and through an inter-layer dielectric between the semiconductor substrate and a shape on the first metal layer; each via of the plurality of vias exposing at least part of the shape on the first metal layer but not penetrating the first metal layer;
   a plurality of single-layer conductive plugs each formed in a respective one of the plurality of vias, each of the conductive plugs coupled to the shape on the first metal layer;
   a dielectric formed over a second surface of the semiconductor substrate and sidewalls of the vias,
   interconnect metal deposited over the dielectric, the interconnect metal forming connection shapes, each connection shape conformal to walls of an associated via of the plurality of vias and electrically coupled through a conductive plug of the plurality of single-layer conductive plugs to a structure of the plurality of structures formed of at least a shape on a first metal layer of the plurality of metal layers; and
   a plurality of solder bumps deposited through openings in a dielectric onto connection shapes of the conductive interconnect layer;
   wherein each conductive plug is disposed between a connection shape of the connection shapes and a structure of the plurality of structures formed of at least a shape on the first metal layer, the conductive plugs electrically coupling the connection shape to the structure, a portion of the plurality of structures formed of at least a shape on the first metal layer, the conductive plug, and a portion of the connection shape forming a multilayer sandwich;
   the conductive plugs being separate from the connection shapes and the first metal layer, and
   the only metal in contact with the conductive plugs being the interconnect metal and the first metal layer,
   and wherein the conductive plugs chemically isolate the interconnect metal from the first layer metal.

7. The photosensor integrated circuit of claim 6 wherein the conductive plugs are formed of an alloy comprising nickel.

8. The photosensor integrated circuit of claim 7 wherein the interconnect metal comprises copper.

9. The photosensor integrated circuit of claim 8, wherein the first semiconductor substrate comprises an array of photodiodes.

10. The photosensor integrated circuit of claim 8, further comprising:
- a second semiconductor substrate comprising an array of photodiodes;
- a plurality of metal and dielectric layers formed on a first surface of the second semiconductor substrate; and
- wherein a top surface of the plurality of metal and dielectric layers formed on the first surface of the semiconductor substrate being bonded to a top surface of the plurality of metal and dielectric layers formed on the first semiconductor substrate.

11. The photosensor integrated circuit of claim 10 wherein the first semiconductor substrate comprises silicon.

* * * * *